(12) United States Patent
Ohno et al.

(10) Patent No.: US 11,488,781 B2
(45) Date of Patent: Nov. 1, 2022

(54) CERAMIC ELECTRONIC DEVICE AND WIRING SUBSTRATE

(71) Applicant: TAIYO YUDEN CO., LTD., Tokyo (JP)

(72) Inventors: Hirotaka Ohno, Takasaki (JP);
Tomoyasu Eguchi, Takasaki (JP);
Kenichi Kitazawa, Takasaki (JP);
Ryuichi Shibasaki, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 193 days.

(21) Appl. No.: 16/700,829

(22) Filed: Dec. 2, 2019

(65) Prior Publication Data

US 2020/0194183 A1 Jun. 18, 2020

(30) Foreign Application Priority Data

Dec. 12, 2018 (JP) .............................. JP2018-232685

(51) Int. Cl.
| | | |
|---|---|---|
| *H01G 4/12* | (2006.01) | |
| *H01G 4/30* | (2006.01) | |
| *H01G 4/012* | (2006.01) | |
| *H05K 1/18* | (2006.01) | |
| *H01G 4/232* | (2006.01) | |

(52) U.S. Cl.
CPC .............. *H01G 4/30* (2013.01); *H01G 4/012* (2013.01); *H05K 1/181* (2013.01); *H01G 4/232* (2013.01); *H05K 2201/10015* (2013.01)

(58) Field of Classification Search
CPC ........................................................ H01G 4/30
USPC ............................................................. 333/185
See application file for complete search history.

(56) References Cited

U.S. PATENT DOCUMENTS

| | | | |
|---|---|---|---|
| 5,815,367 A | 9/1998 | Asakura et al. | |
| 9,734,950 B2 * | 8/2017 | Sasaki | H01G 4/385 |
| 10,546,693 B2 * | 1/2020 | Imai | H01G 4/30 |
| 2006/0291138 A1 * | 12/2006 | Kang | H01G 4/30 |
| | | | 361/307 |
| 2016/0189868 A1 | 6/2016 | Sasaki et al. | |
| 2016/0344181 A1 * | 11/2016 | Matsunaga | H02H 9/046 |

(Continued)

FOREIGN PATENT DOCUMENTS

| | | |
|---|---|---|
| JP | H04105311 A | 4/1992 |
| JP | H07226331 A | 8/1995 |

(Continued)

*Primary Examiner* — Stanley Tso
(74) *Attorney, Agent, or Firm* — Law Office of Katsuhiro Arai

(57) ABSTRACT

A ceramic electronic device includes: a multilayer chip in which each of internal electrode layers and each of dielectric layers are alternately stacked, wherein the multilayer chip has a first capacity region having a first electrostatic capacity $C_1$ and a first inductance $L_1$ and a second capacity region having a second electrostatic capacity $C_2$ and a second inductance $L_2$, wherein the first electrostatic capacity $C_1$, the first inductance $L_1$, the second electrostatic capacity $C_2$ and the second inductance $L_2$ satisfy $(C_1 \cdot L_1)/(C_2 \cdot L_2) < 0.5$ or $1.9 < (C_1 \cdot L_1)/(C_2 \cdot L_2)$.

6 Claims, 19 Drawing Sheets

(56) References Cited

U.S. PATENT DOCUMENTS

| | | | |
|---|---|---|---|
| 2018/0160541 A1 | 6/2018 | Fujita | |
| 2018/0182558 A1* | 6/2018 | Byun | H01G 4/232 |
| 2018/0226194 A1* | 8/2018 | Kirk | H01G 4/38 |
| 2018/0308636 A1* | 10/2018 | de Rochemont | H01L 28/55 |
| 2020/0152386 A1* | 5/2020 | Togou | H01G 4/012 |
| 2020/0219861 A1* | 7/2020 | Kamgaing | H01L 23/49827 |
| 2021/0272750 A1* | 9/2021 | Lee | H01L 23/60 |

FOREIGN PATENT DOCUMENTS

| | | |
|---|---|---|
| JP | H09246098 A | 9/1997 |
| JP | 2013131548 A | 7/2013 |
| JP | 2016127045 A | 7/2016 |
| JP | 2016187036 A | 10/2016 |
| JP | 2018093075 A | 6/2018 |

\* cited by examiner

CERAMIC ELECTRONIC DEVICE AND WIRING SUBSTRATE

CROSS-REFERENCE TO RELATED APPLICATION

This application is based upon and claims the benefit of priority of the prior Japanese Patent Application No. 2018-232685, filed on Dec. 12, 2018, the entire contents of which are incorporated herein by reference.

FIELD

A certain aspect of the present invention relates to a ceramic electronic device and a wiring substrate.

BACKGROUND

There are various types of ceramic electronic devices to be mounted on a wiring substrate. Multilayer ceramic capacitors have a structure in which each of ceramic dielectric layers and each of internal electrode layers are alternately stacked. Therefore, the multilayer ceramic capacitors can be downsized and achieve a large capacity.

When a wiring is provided on the multilayer ceramic capacitors, voltage fluctuation in the wiring can be suppressed. And, it is possible to reduce noise components superimposed with the wiring (for example, see Japanese Patent Application Publication No. H04-105311, Japanese Patent Application Publication No. H07-226331, Japanese Patent Application Publication No. H09-246098 and Japanese Patent Application Publication No. 2013-131548 hereinafter referred to as Documents 1 to 4). The effect is called a decoupling effect.

The decoupling effect is the most effective when a frequency of the noise component coincides with a resonance frequency of the multilayer ceramic capacitors. In Documents 1 to 4, when a plurality of capacities are included in a single multilayer ceramic capacitor, a plurality of resonance frequencies appear in the single multilayer ceramic capacitor. In this case, the single multilayer ceramic capacitor reduces a plurality of noise components having a different frequency from each other.

SUMMARY OF THE INVENTION

However, Documents 1 to 4 do not disclose each value range of each parameter such as a capacity, an inductance or the like of the multilayer ceramic capacitor achieving the plurality of resonance frequencies. It is therefore difficult to achieve a plurality of resonance frequencies in a single multilayer ceramic capacitor. It is difficult to manufacture which is capable of reducing a plurality of noise components.

The present invention has a purpose of providing a ceramic electronic device and a wiring substrate that are capable of producing a plurality of resonance frequencies.

According to an aspect of the present invention, there is provided a ceramic electronic device including: a multilayer chip in which each of internal electrode layers and each of dielectric layers are alternately stacked, wherein the multilayer chip has a first capacity region having a first electrostatic capacity $C_1$ and a first inductance $L_1$ and a second capacity region having a second electrostatic capacity $C_2$ and a second inductance $L_2$, wherein the first electrostatic capacity $C_1$, the first inductance $L_1$, the second electrostatic capacity $C_2$ and the second inductance $L_2$ satisfy $(C_1 \cdot L_1)/(C_2 \cdot L_2) < 0.5$ or $1.9 < (C_1 \cdot L_1)/(C_2 \cdot L_2)$.

According to another aspect of the present invention, there is provided a wiring substrate including: an above-mentioned ceramic electronic device that is mounted on the wiring substrate.

DETAILED DESCRIPTION

A description will be given of an embodiment with reference to the accompanying drawings.

Figure 1:
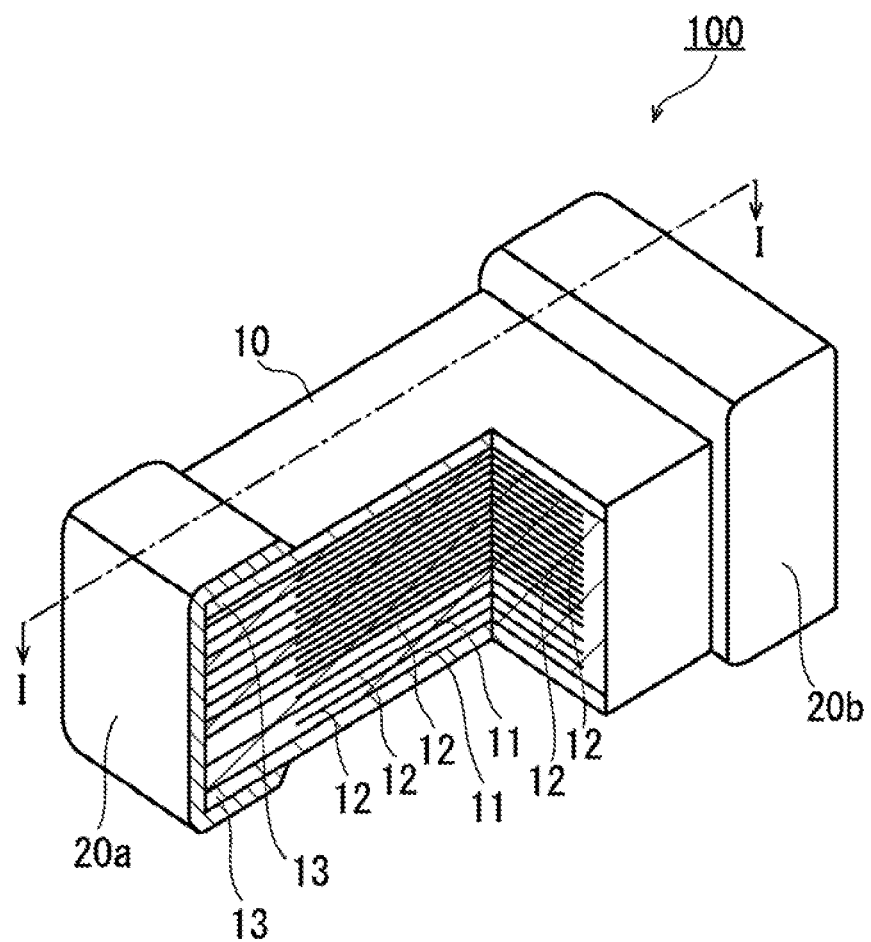
FIG. 1 illustrates a perspective view of a multilayer ceramic capacitor in which a cross section of a part of the multilayer ceramic capacitor is illustrated.

(Embodiment) FIG. 1 illustrates a perspective view of a multilayer ceramic capacitor 100 in accordance with an embodiment, in which a cross section of a part of the multilayer ceramic capacitor 100 is illustrated. As illustrated in FIG. 1, the multilayer ceramic capacitor 100 includes a multilayer chip 10 having a rectangular parallelepiped shape, and a pair of external electrodes 20a and 20b that are respectively provided at two end faces of the multilayer chip 10 facing each other.

The multilayer chip 10 has a structure designed to have dielectric layers 11 and internal electrode layers 12 alternately stacked. The dielectric layer 11 includes ceramic material acting as a dielectric material. The internal electrode layers 12 include a base metal material. End edges of the internal electrode layers 12 are alternately exposed to a first end face of the multilayer chip 10 and a second end face of the multilayer chip 10 that is different from the first end face. In the embodiment, the first end face faces with the second end face. The external electrode 20a is provided on the first end face. The external electrode 20b is provided on the second end face. Thus, the internal electrode layers 12 are alternately conducted to the external electrode 20a and the external electrode 20b. Thus, the multilayer ceramic capacitor 100 has a structure in which a plurality of dielectric layers 11 are stacked and each two of the dielectric layers 11 sandwich the internal electrode layer 12. In the multilayer chip 10, the internal electrode layer 12 is positioned at an outermost layer. The upper face and the lower face of the multilayer chip 10 that are the internal electrode layers 12 are covered by cover layers 13. A main component of the cover layer 13 is a ceramic material. For example, a main component of the cover layer 13 is the same as that of the dielectric layer 11.

For example, the multilayer ceramic capacitor 100 may have a length of 0.25 mm, a width of 0.125 mm and a height of 0.125 mm. The multilayer ceramic capacitor 100 may have a length of 0.4 mm, a width of 0.2 mm and a height of 0.2 mm. The multilayer ceramic capacitor 100 may have a length of 0.6 mm, a width of 0.3 mm and a height of 0.3 mm. The multilayer ceramic capacitor 100 may have a length of 1.0 mm, a width of 0.5 mm and a height of 0.5 mm. The multilayer ceramic capacitor 100 may have a length of 3.2 mm, a width of 1.6 mm and a height of 1.6 mm. The multilayer ceramic capacitor 100 may have a length of 4.5 mm, a width of 3.2 mm and a height of 2.5 mm. However, the size of the multilayer ceramic capacitor 100 is not limited.

A main component of the internal electrode layers 12 is a base metal such as nickel (Ni), copper (Cu), tin (Sn) or the like. The internal electrode layers 12 may be made of a noble metal such as platinum (Pt), palladium (Pd), silver (Ag), gold (Au) or alloy thereof. A thickness of the internal electrode layer 12 is, for example, 0.5 μm or less. It is preferable that the thickness of the internal electrode layer 12 is 0.3 μm or less. The dielectric layers 11 are mainly composed of a ceramic material that is expressed by a general formula $ABO_3$ and has a perovskite structure. The perovskite structure includes $ABO_{3-\alpha}$ having an off-stoichiometric composition. For example, the ceramic material is such as $BaTiO_3$ (barium titanate), $CaZrO_3$ (calcium zirconate), $CaTiO_3$ (calcium titanate), $SrTiO_3$ (strontium titanate), $Ba_{1-x-y}Ca_xSr_yTi_{1-z}Zr_zO_3$ ($0 \leq x \leq 1$, $0 \leq y \leq 1$, $0 \leq z \leq 1$) having a perovskite structure.

Figure 2:
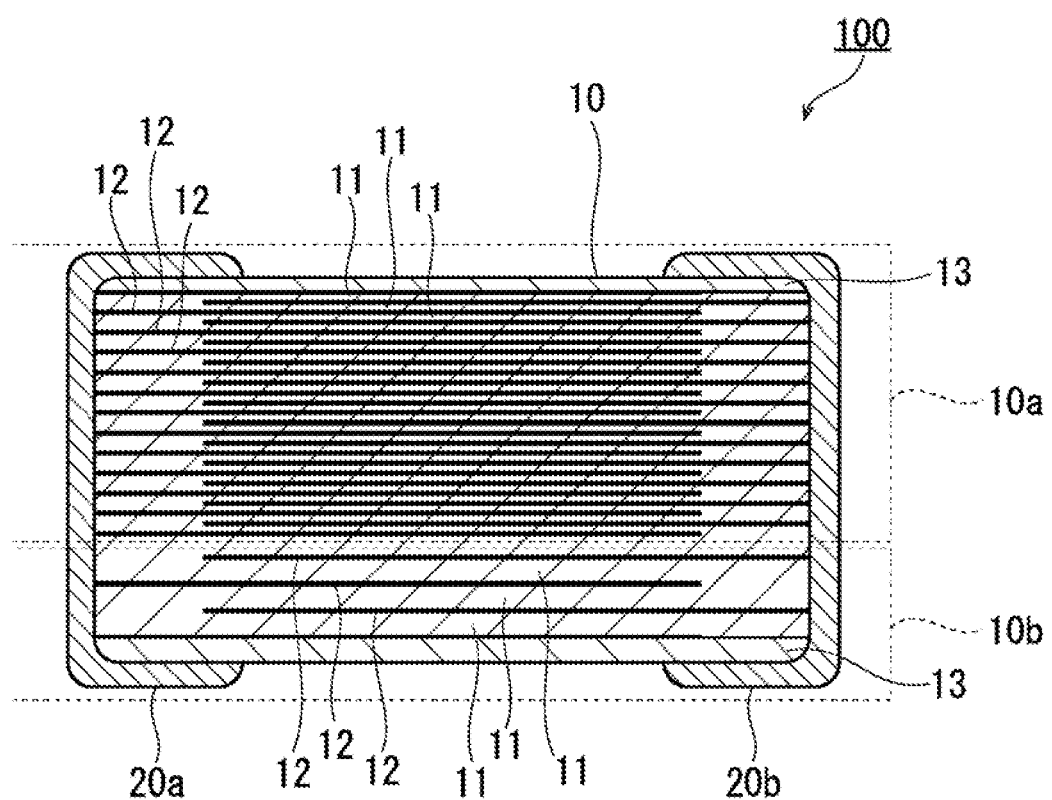
FIG. 2 illustrates a cross sectional view taken along a line I-I of FIG. 1.

FIG. 2 illustrates a cross sectional view taken along a line I-I of FIG. 1. As illustrated in FIG. 2, the multilayer chip 10 has a first capacity region 10a and a second capacity region 10b. Thicknesses of the dielectric layers 11 of the first capacity region 10a are different from those of the dielectric layers 11 of the second capacity region 10b. In the embodiment, the thicknesses of the dielectric layers 11 of the first capacity region 10a are smaller than those of the dielectric layers 11 of the second capacity region 10b. And, a first electrostatic capacity $C_1$ of the first capacity region 10a is larger than a second electrostatic capacity $C_2$ of the second capacity region 10b.

The thicknesses of the dielectric layers 11 of the first capacity region 10a and the second capacity region 10b are not limited. The thicknesses of the dielectric layers 11 of the first capacity region 10a may be 0.6 μm to 1.2 μm (for example, 0.9 μm). The thicknesses of the dielectric layers 11 of the second capacity region 10b may be 5.0 μm to 10.0 μm (for example, 7.5 μm). The thicknesses of the dielectric layers 11 of the first capacity region 10a may be equal to each other. The thicknesses of the dielectric layers 11 of the second capacity region 10b may be equal to each other.

When the multilayer ceramic capacitor 100 has the first capacity region 10a and the second capacity region 10b of which the electrostatic capacity is different from each other, it is thought that the multilayer ceramic capacitor 100 has two resonance frequencies according to the first capacity region 10a and the second capacity region 10b. The present inventor performed the following experiment in order to confirm the fact.

Figure 3:
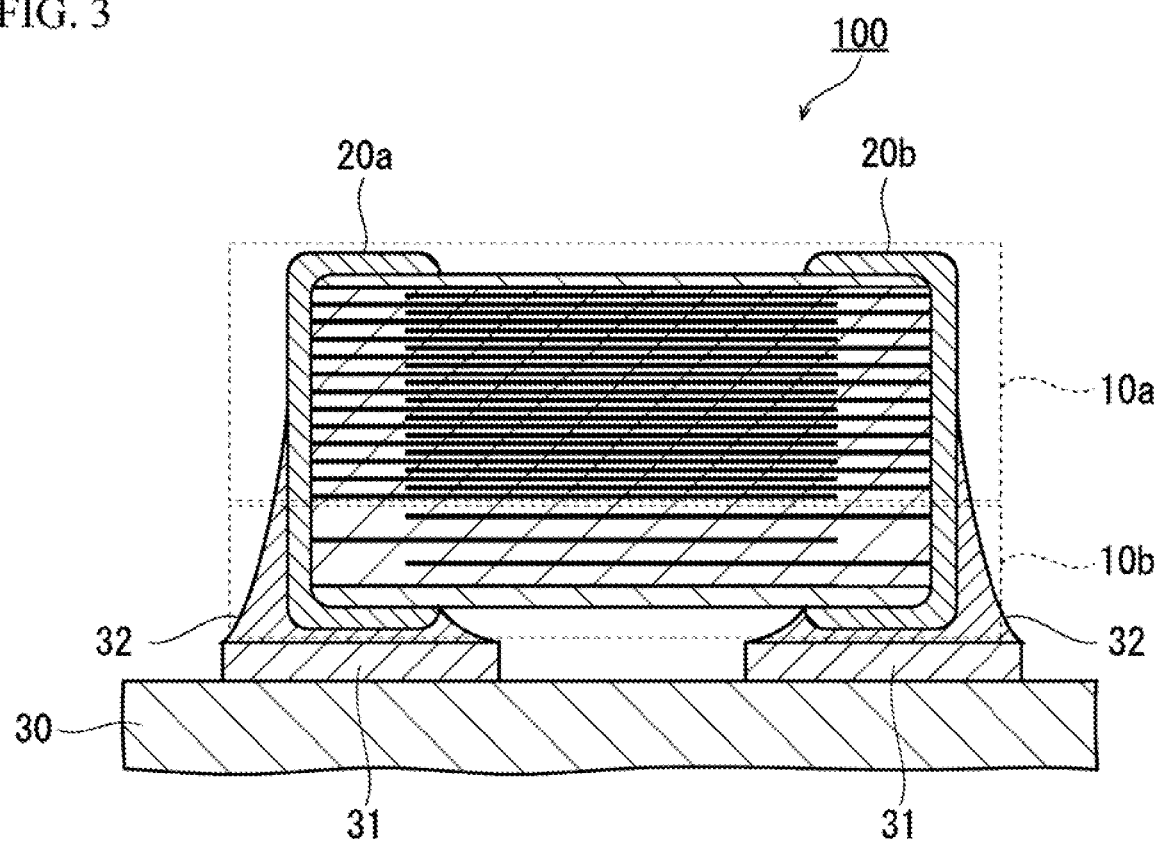
FIG. 3 illustrates a cross sectional view of a sample used for the experiment.

FIG. 3 illustrates a cross sectional view of a sample used for the experiment. As illustrated in FIG. 3, in the experiment, the multilayer ceramic capacitor 100 was mounted on a wiring layer 31 of a wiring substrate 30. The external electrodes 20a and the external electrode 20b were connected to the wiring layer 31 through a solder 32. The second capacity region 10b was under the first capacity region 10a. And, the second capacity region 10b was mounted on the wiring substrate 30.

Figure 4:
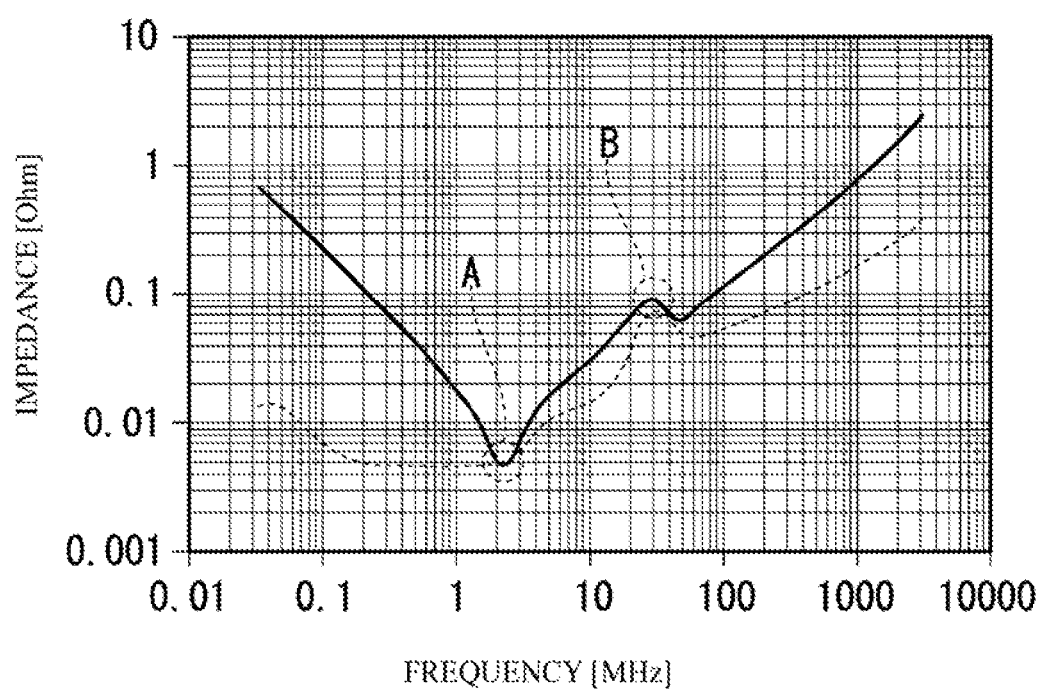
FIG. 4 illustrates a graph indicating a relationship between a frequency of a high frequency signal and impedance in a case where a sample of FIG. 3 is used.

A high frequency signal was input to the multilayer ceramic capacitor 100 from the wiring layer 31. And, a graph of a relationship between a frequency of the high frequency signal and impedance of the multilayer ceramic capacitor 100 was obtained. FIG. 4 illustrates the graph.

A solid line of FIG. 4 indicates the impedance in which contact resistance between the external electrodes 20a and 20b and the wiring layer 31 was ignored. A dotted line indicates a resistance component. For example, the resistance component is a resistance component between the external electrodes 20a and 20b and the wiring layer 31 or a resistance component of a capacitor.

As illustrated in FIG. 4, the graph of the solid line has two local minimum points A and B. It is thought that this was because the multilayer chip 10 has the first capacity region 10a and the second capacity region 10b of which the electrostatic capacity was different from each other. When there are the two local minimum points A and B, the multilayer ceramic capacitor 100 can absorb noise of two frequencies according to the local minimum points A and B.

Next, the present inventor performed an experiment in order to confirm whether the same tendency as FIG. 4 can be seen even if the multilayer ceramic capacitor 100 is turned upside down and is mounted on the wiring substrate 30.

Figure 5:
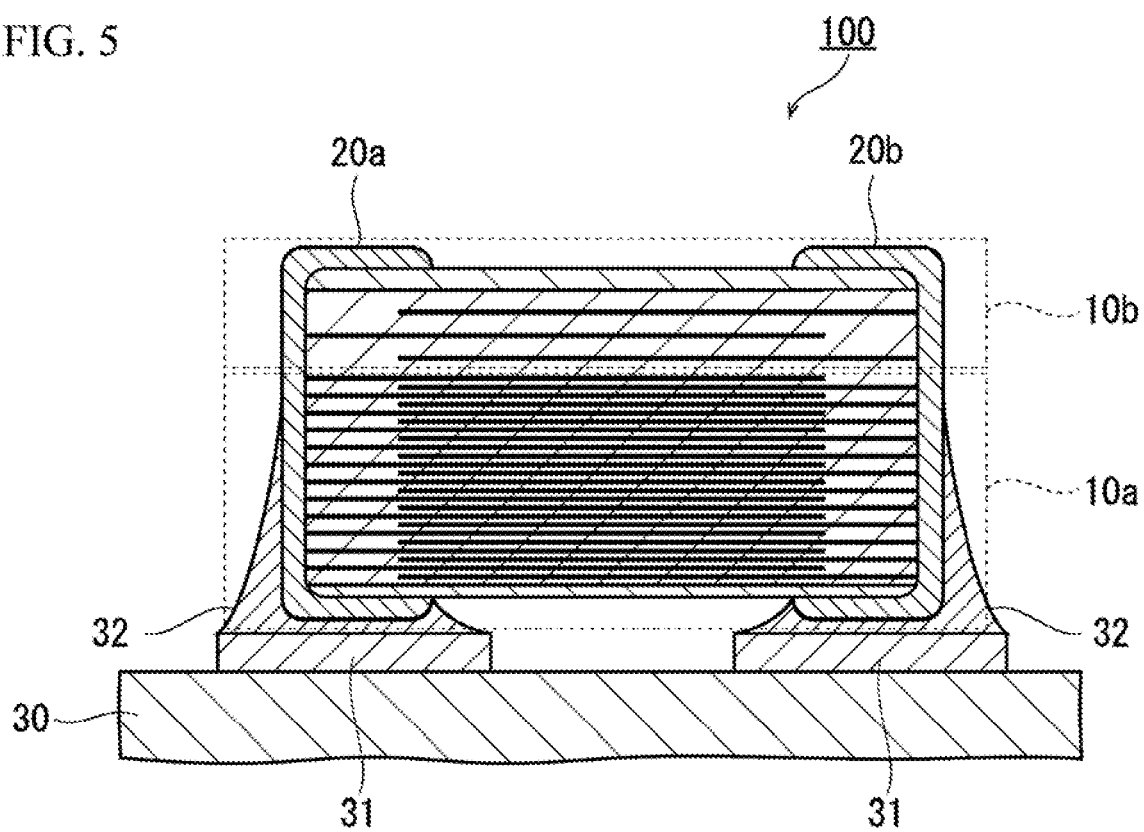
FIG. 5 illustrates a cross sectional view of a sample used for an experiment.
Figure 6:
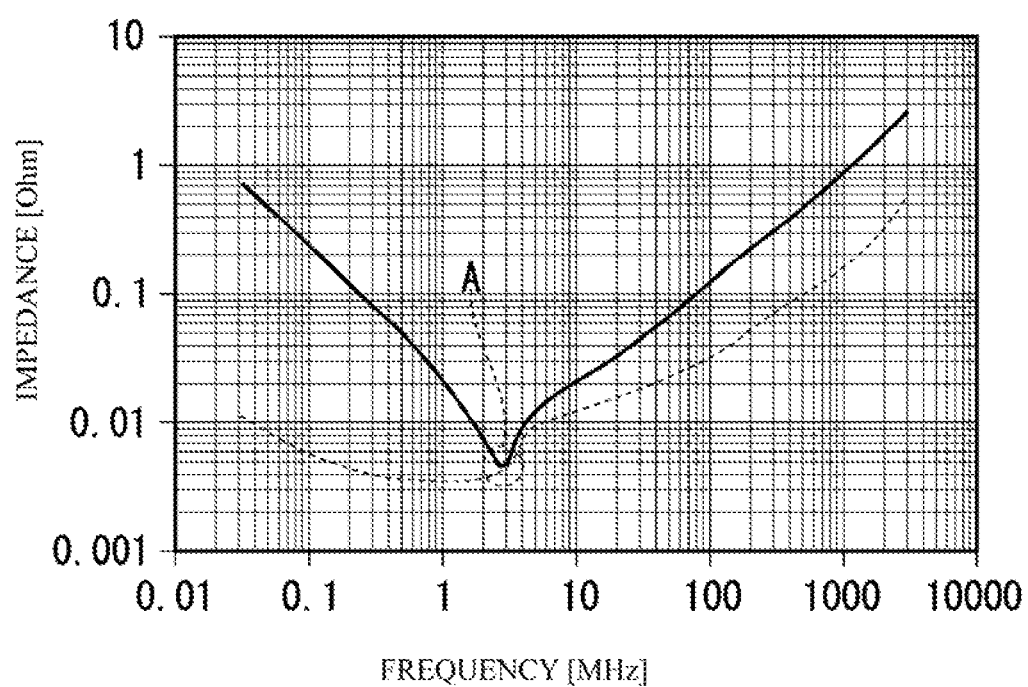
FIG. 6 illustrates a graph indicating a relationship between a frequency of a high frequency signal and impedance in a case where a sample of FIG. 6 is used.

FIG. 5 illustrates a cross sectional view of a sample used for the experiment. As illustrated in FIG. 5, in the experiment, the multilayer ceramic capacitor 100 was turned upside down, in comparison to FIG. 3. The first capacity region 10a was under the second capacity region 10b. And the first capacity region 10a was mounted on the wiring substrate 30. As well as FIG. 3, a high frequency signal was input to the multilayer ceramic capacitor 100 via the wiring layer 31. And a graph of a relationship between the frequency and the impedance was obtained. FIG. 6 illustrates the graph.

As well as FIG. 4, a solid line of FIG. 6 indicates the impedance in which the contact resistance between the external electrodes 20a and 20b and the wiring layer 31 was ignored. A dotted line indicates a resistance component. For example, the resistance component is a contact resistance between the external electrodes 20a and 20b and the wiring layer 31 or a resistance component of a capacitor.

As illustrated in FIG. 6, the graph has only one local minimum point A. Therefore, it is apparent that the multilayer ceramic capacitor 100 cannot absorb noise of two frequencies.

In this manner, the present inventor has found that when the second capacity region 10b is mounted on the wiring substrate 30, the multilayer ceramic capacitor 100 has two resonance frequencies, and when the first capacity region 10a is mounted on the wiring substrate 30, the multilayer ceramic capacitor 100 has one resonance frequency. With respect to the fact, the present inventors reviewed the following matters.

Figure 7:
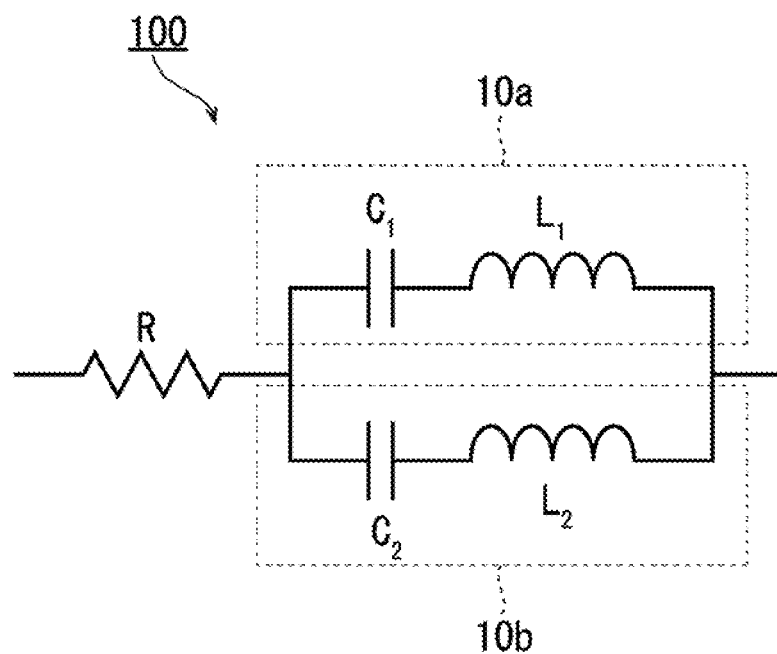
FIG. 7 illustrates an equivalent circuit diagram of a multilayer ceramic capacitor.

FIG. 7 illustrates an equivalent circuit diagram of the multilayer ceramic capacitor 100. As illustrated in FIG. 7, the first capacity region 10a has a circuit structure which is equivalent to a case where a first inductance $L_1$ is connected to the first electrostatic capacity $C_1$ in series. The first inductance $L_1$ is generated in a current path from the internal electrode layer 12 or the wiring layer 31 (illustrated in FIG. 3) to the first capacity region 10a.

In this manner, the second capacity region 10b has a circuit structure which is equivalent to a case where a second inductance $L_2$ is connected to the second electrostatic capacity $C_2$ in series. The second inductance $L_2$ is generated in a current path from the internal electrode layer 12 or the wiring layer 31 (illustrated in FIG. 3) to the second capacity region 10b.

The equivalent circuit of the multilayer ceramic capacitor 100 is a circuit in which a contact resistance R is, in series, connected to a circuit in which the first capacity region 10a and the second capacity region 10b are connected in parallel with each other. The contact resistance R is a resistance generated between the wiring layer 31 and the external electrode 20a and 20b. In this case, impedance Za of the first capacity region 10a is expressed by the following formula (1).

$$Z_a = \frac{1}{j\omega C_1} + j\omega L_1 \tag{1}$$

In the formula (1), "$\omega$" indicates an angular frequency of a high frequency signal. "j" indicates an imaginary unit. In this manner, impedance Zb of the second capacity region 10b is expressed by the following formula (2).

$$Z_b = \frac{1}{j\omega C_2} + j\omega L_2 \tag{2}$$

Impedance Z of the whole of the equivalent circuit of FIG. 7 is expressed by the following formula (3).

$$|Z| = \sqrt{\left(R_1 + \frac{Z_a \cdot Z_b}{Z_a + Z_b}\right)^2} \tag{3}$$

As shown in the formulas (1) to (3), the impedance Z of the whole of the multilayer ceramic capacitor 100 is determined by the first electrostatic capacity $C_1$, the second electrostatic capacity $C_2$, the first inductance $L_1$ and the second inductance $L_2$. Table 1 shows an example of each value of the parameters $C_1$, $C_2$, $L_1$ and $L_2$.

TABLE 1

| data No | R (Ω) | $L_1$ (H) | $C_1$ (F) | $L_2$ (H) | $C_2$ (F) |
|---|---|---|---|---|---|
| 1 | $5.0 \times 10^{-3}$ | $5.0 \times 10^{-10}$ | $1.0 \times 10^{-5}$ | $1.4 \times 10^{-9}$ | $1.0 \times 10^{-8}$ |

Each value of Table 1 is selected in order to obtain the impedance Z from the formula (3).

Figure 8:
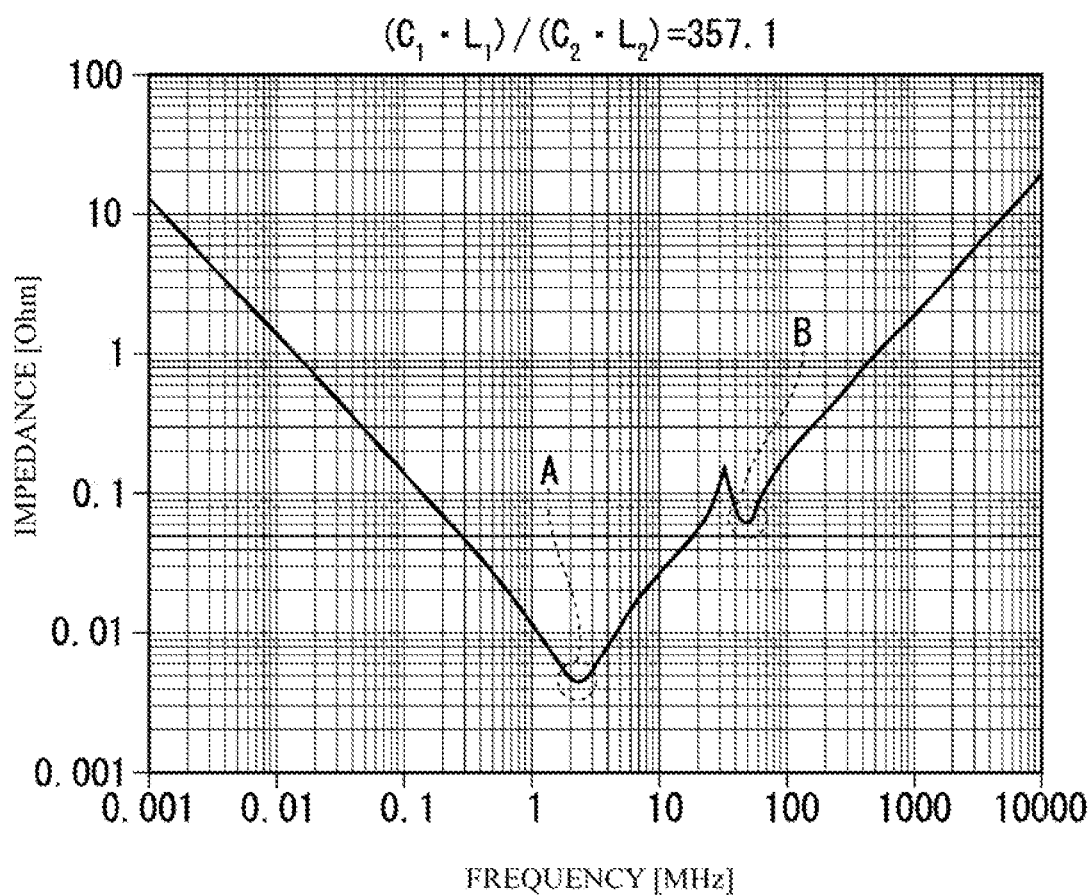
FIG. 8 illustrates a graph indicating a relationship between a frequency of a high frequency signal and impedance obtained with use of values of Table 1.

The present inventor has obtained a graph indicating a relationship between the frequency of the high frequency signal and the impedance Z by substituting each value of Table 1 to the formula (3). FIG. 8 illustrates the graph. As illustrated in FIG. 8, the graph has two local minimum points A and B. Thus, as illustrated in FIG. 3, the case where two local minimum points appear is reproduced, as well as the case where the first capacity region 10a is mounted on the wiring substrate 30.

Next, a description will be given of a situation in which only one local minimum point appears as illustrated in FIG. 6. A resonance frequency is a frequency at which impedance is zero. It is therefore possible to calculate a resonance frequency of the first capacity region 10a from the formula (4).

$$Z_a = 0 = \frac{1}{j\omega C_1} + j\omega L_1 \tag{4}$$

When a solution of $\omega$ is calculated from the formula (4), the following formula (5) is obtained.

$$\omega = \sqrt{\frac{1}{C_1 \cdot L_1}} \tag{5}$$

In this manner, the resonance frequency of the second capacity region 10b is calculated from the following formula (6).

$$Z_b = 0 = \frac{1}{j\omega C_2} + j\omega L_2 \tag{6}$$

When a solution of $\omega$ is calculated from the formula (6), the following formula (7) is obtained.

$$\omega = \sqrt{\frac{1}{C_2 \cdot L_2}} \tag{7}$$

It is thought that each of local minimum points of the resonance frequency of the multilayer ceramic capacitor 100 corresponds to each of the local minimum points of the first capacity region 10a and the second capacity region 10b. And it is thought that when the local minimum points coincide with each other, the number of the resonance frequency of the multilayer ceramic capacitor 100 is one. And so, it is assumed that the value of the formula (5) is equal to the value of the formula (7), as expressed by the following formula (8).

$$\sqrt{\frac{1}{C_1 \cdot L_1}} = \sqrt{\frac{1}{C_2 \cdot L_2}} \quad (8)$$

Thus, the following formula (9) is obtained.

$$C_1 \cdot L_1 = C_2 \cdot L_2 \quad (9)$$

When the both sides of the formula (9) are divided by $C_2 \cdot L_2$, the following formula (10) is obtained.

$$\frac{C_1 \cdot L_1}{C_2 \cdot L_2} = 1 \quad (10)$$

In accordance with the formula (10), it is thought that when the ratio of $C_1 \cdot L_1$ with respect to $C_2 \cdot L_2$ gets closer to 1, the resonance frequency of the first capacity region 10a gets closer to the resonance frequency of the second capacity region 10b and the number of the resonance frequency of the multilayer ceramic capacitor 100 is one. In order to confirm the hypothesis, the present inventor adjusts the parameters $C_1$, $C_2$, $L_1$ and $L_2$ so the ratio of $C_1 \cdot L_1$ with respect to $C_2 \cdot L_2$ becomes 1, as shown in the data No. 2 of Table 2.

TABLE 2

| data No | R (Ω) | $L_1$ (H) | $C_1$ (F) | $L_2$ (H) | $C_2$ (F) | $(C_1 \cdot L_1)/(C_2 \cdot L_2)$ |
|---|---|---|---|---|---|---|
| 1 | $5.0 \times 10^{-3}$ | $5.0 \times 10^{-10}$ | $1.0 \times 10^{-5}$ | $1.4 \times 10^{-9}$ | $1.0 \times 10^{-8}$ | 357 |
| 2 | $5.0 \times 10^{-3}$ | $5.0 \times 10^{-10}$ | $1.0 \times 10^{-5}$ | $5.0 \times 10^{-7}$ | $1.0 \times 10^{-8}$ | 1.0 |

The data No. 1 of Table 2 is the same as the data of Table 1.

Figure 9:
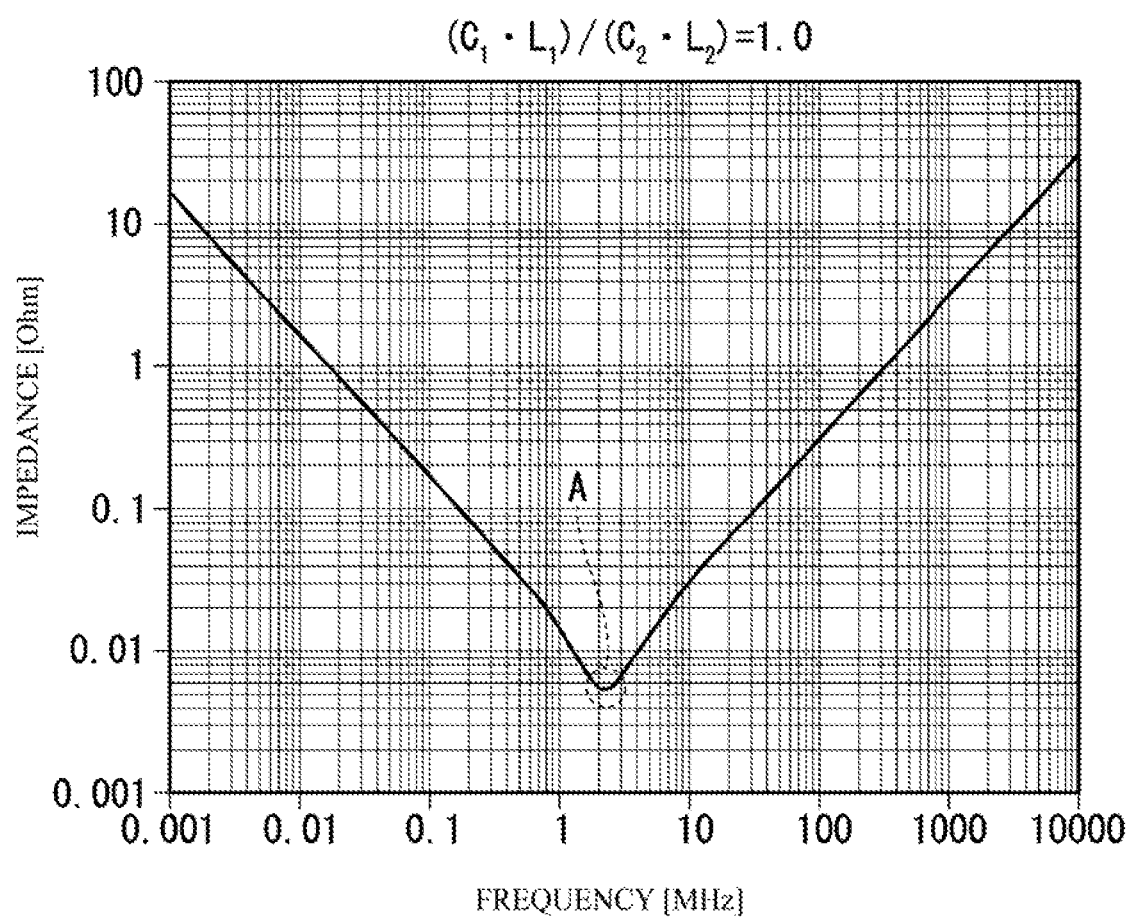
FIG. 9 illustrates a graph indicating a relationship between a frequency of a high frequency signal and impedance obtained with use of values of data No. 2 of Table 2.

FIG. 9 illustrates a graph indicating a relationship between the frequency of the high frequency signal and the impedance Z obtained by substituting each value of No. 2 of Table 2 into the formula (3). As illustrated in FIG. 9, when the ratio of $C_1 \cdot L_1$ with respect to $C_2 \cdot L_2$ is 1, only one local minimum point appears. And the same situation as FIG. 6 is reproduced.

From the results, it is determined whether the multilayer ceramic capacitor 100 has two resonance frequencies, by determining whether the ratio of $C_1 \cdot L_1$ with respect to $C_2 \cdot L_2$ is close to 1 or not.

Next, a description will be given of the first inductance $L_1$ of the first capacity region 10a and the second inductance $L_2$ of the second capacity region 10b.

Figure 10A:
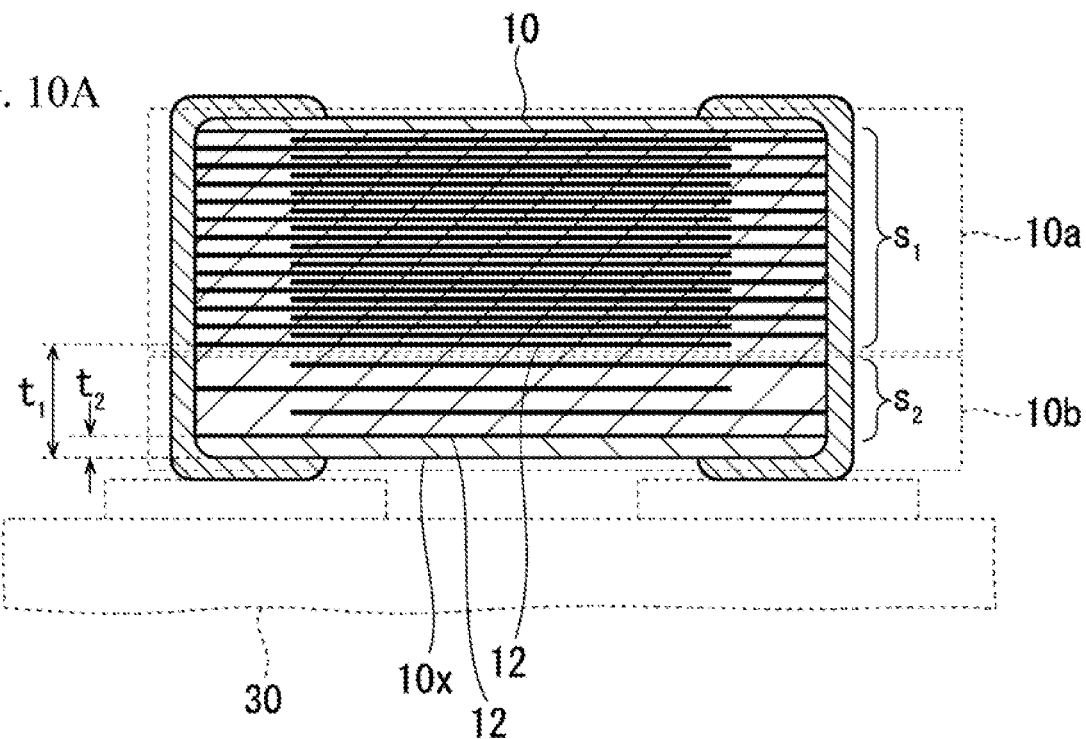
FIG. 10A illustrates a cross sectional view for describing inductance of each capacity region in a case where a second capacity region of a multilayer ceramic capacitor is mounted on a wiring substrate.

FIG. 10A illustrates a cross sectional view for describing the first inductance $L_1$ of the first capacity region 10a and the second inductance $L_2$ of the second capacity region 10b in a case where the second capacity region 10b is mounted on the wiring substrate 30. In FIG. 10A, an interval between a lower face 10x of the multilayer chip 10 facing with the wiring substrate 30 and the bottom internal electrode layer 12 of the first capacity region 10a is $t_1$. An interval between the bottom internal electrode layer 12 of the second capacity region 10b and the lower face 10x is $t_2$.

Moreover, the number of the internal electrode layer 12 in the first capacity region 10a is $s_1$. The number of the internal electrode layer 12 in the second capacity region 10b is $s_2$. It is known that an inductance L of a conductor having a circular cross section having a diameter of d (m) and having a length l (m) is expressed by the following formula (11).

$$L = 1\left(\ln\frac{4l}{d} - 1\right) \cdot 200 \times 10^{-9} \quad (11)$$

As indicated in the formula (11), the inductance L is approximately proportional to the length l of the conductor.

A part of the first capacity region 10a of which the current density is the highest is the bottom internal electrode layer 12 which is the closet to the wiring substrate 30 in the first capacity region 10a. It is thought that the first inductance $L_1$ of the first capacity region 10a is proportional to the interval $t_1$ which is a length of a current path to the bottom internal electrode layer 12, on the analogy of the formula (11). Moreover, it is thought that the first inductance $L_1$ is proportional to a total area of all of the internal electrode layers 12 in the first capacity region 10a, on the analogy of the formula (11). Each area of the internal electrode layers 12 is approximately equal to each other. Therefore, a total area of all of the internal electrode layers 12 in the first capacity region 10a is proportional to the number $s_1$ of the internal electrode layers 12 in the first capacity region 10a. And so, in the embodiment, the first inductance $L_1$ of the first capacity region 10a is approximated by the following formula (12).

$$L_1 = \alpha \cdot t_1 \cdot s_1 \quad (12)$$

In this manner, the second inductance $L_2$ of the second capacity region 10b is approximated by the following formula (13).

$$L_2 = \alpha \cdot t_2 \cdot s_2 \quad (13)$$

In the following formulas, there may be a case where a proportional constant α is 1 in the formula (12) and the formula (13). This is because the embodiment uses a ratio of the first inductance $L_1$ and the second inductance $L_2$, and the ratio does not depend on the proportional constant.

Figure 10B:
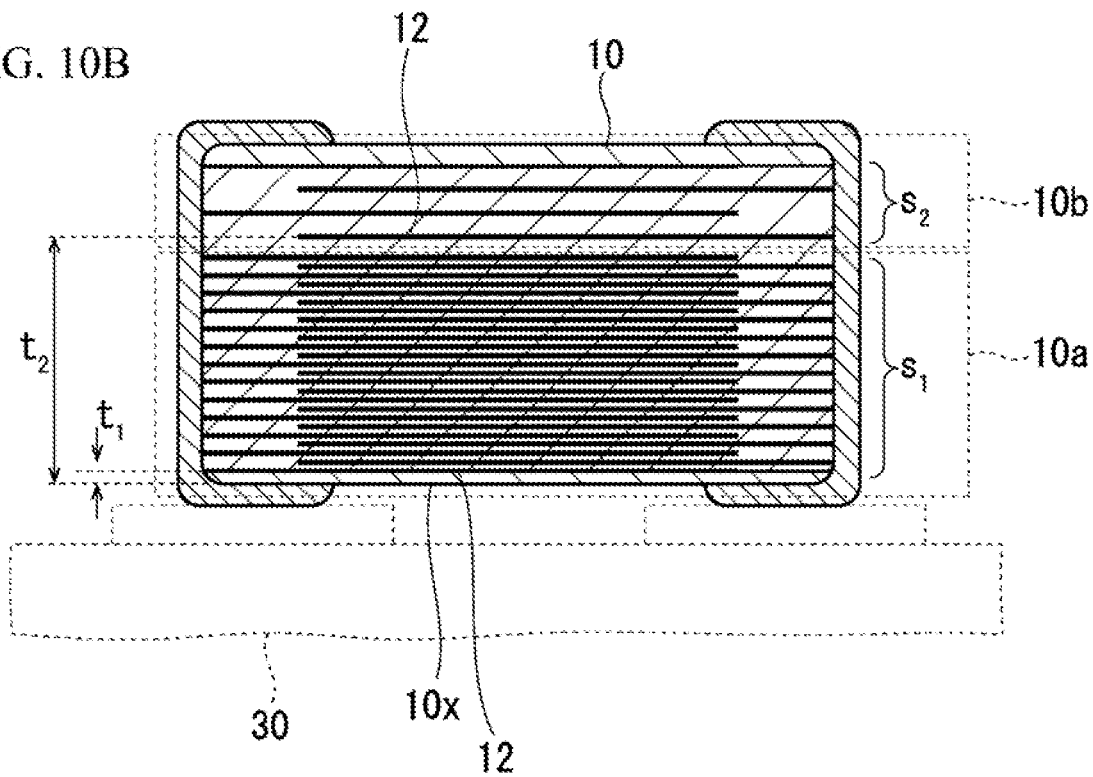
FIG. 10B illustrates a cross sectional view for describing inductance of each capacity region in a case where a first capacity region of a multilayer ceramic capacitor is mounted on a wiring substrate.

FIG. 10b illustrates a cross sectional view for describing the first inductance $L_1$ of the first capacity region 10a and the second inductance $L_2$ of the second capacity region 10b in a case where the first capacity region 10a is mounted on the wiring substrate 30. In this case, it is also possible to calculate the first inductance $L_1$ and the second inductance $L_2$ in accordance with the formula (12) and the formula (13). When the first inductance $L_1$ and the second inductance $L_2$ of the formula (12) and the formula (13) are used, a right side of the formula (10) is expressed by the following formula (14).

$$\frac{C_1 \cdot L_1}{C_2 \cdot L_2} = \frac{C_1 \cdot t_1 \cdot s_1}{C_2 \cdot t_2 \cdot s_2} \quad (14)$$

As indicated by the formula (14), the ratio of the $C_1 \cdot L_1$ and $C_2 \cdot L_2$ includes the parameters $t_1$, $t_2$, $s_1$ and $s_2$ of the multilayer ceramic capacitor 100. These parameters are used for designing the multilayer ceramic capacitor 100. The present inventor has reviewed a relationship between the frequency and the impedance of the multilayer ceramic capacitor 100 as follows, with use of the parameters for design.

Figure 11A:
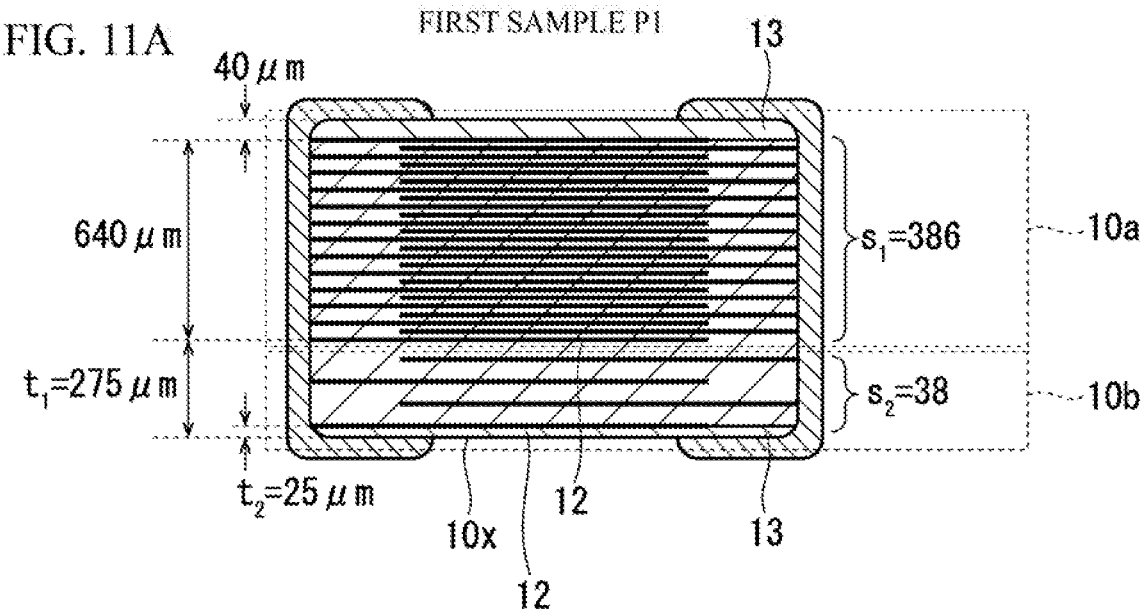
FIG. 11A schematically illustrates a first sample P1 used for review.
Figure 11B:
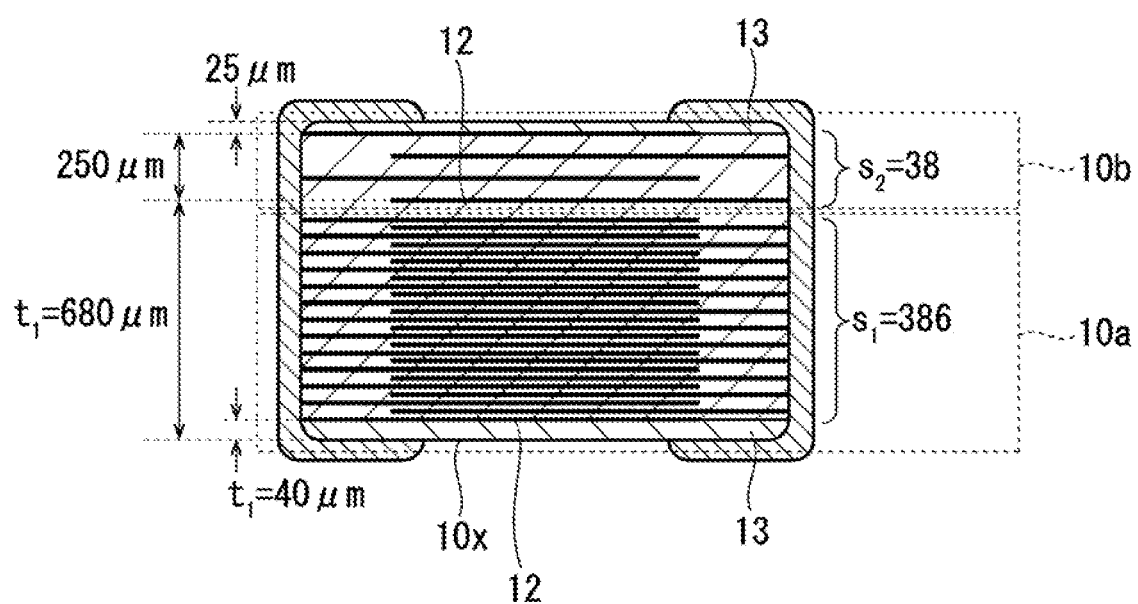
FIG. 11B schematically illustrates a second sample P2 used for review.

FIG. 11A and FIG. 11B schematically illustrate a first sample P1 and a second sample P2 used for the review. In the first sample P1 in FIG. 11A, the second capacity region 10b is mounted on the wiring substrate 30. On the other hand, in the second sample P2 of FIG. 11B, the first capacity region 10a is mounted on the wiring substrate 30. In this manner, although the first sample P1 and the second sample P2 have the same structure, a mounting direction to the wiring substrate 30 is different from each other between the first sample P1 and the second sample P2.

The size of the first sample P1 is the same as that of the second sample P2. In the size, the length is 1.0±0.2 mm. The width is 0.5±0.2 mm. The height is 0.95±0.05 mm.

Figure 13:
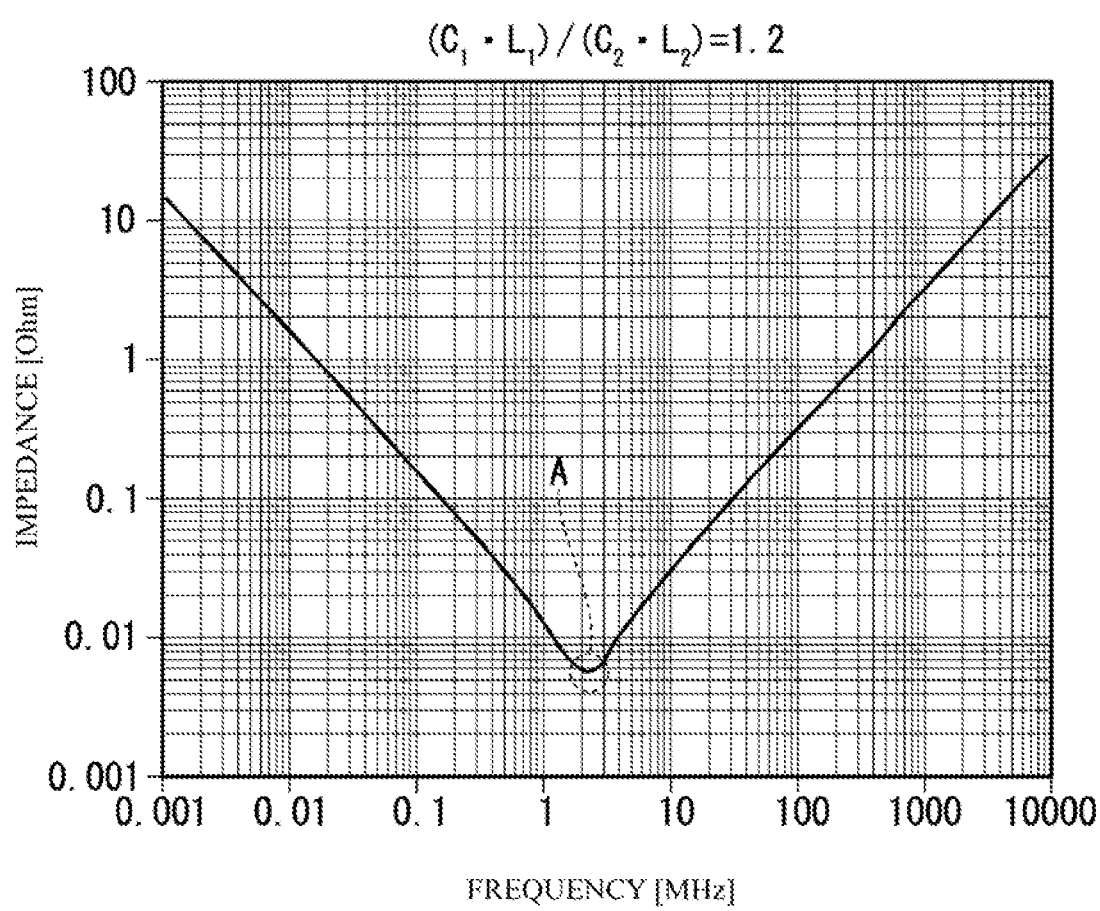
FIG. 13 illustrates a graph of a relationship between a frequency of a high frequency signal and impedance obtained when each value of data No. 4 of Table 4 is used.

FIG. 13 illustrates a graph of a relationship between the frequency of the high frequency signal and the impedance Z that are obtained in a case where each value of the data No. 4 of Table 4 is substituted to the formula (3). As illustrated in FIG. 13, a single local minimum point A appears in the graph. Therefore, the same situation of FIG. 6 is reproduced.

From the results, it is apparent that the number of the local minimum point is reproduced by approximating the first inductance $L_1$ and the second inductance $L_2$ in accordance with the formula (12) and the formula (13), with respect to the multilayer ceramic capacitor 100.

Figure 12:
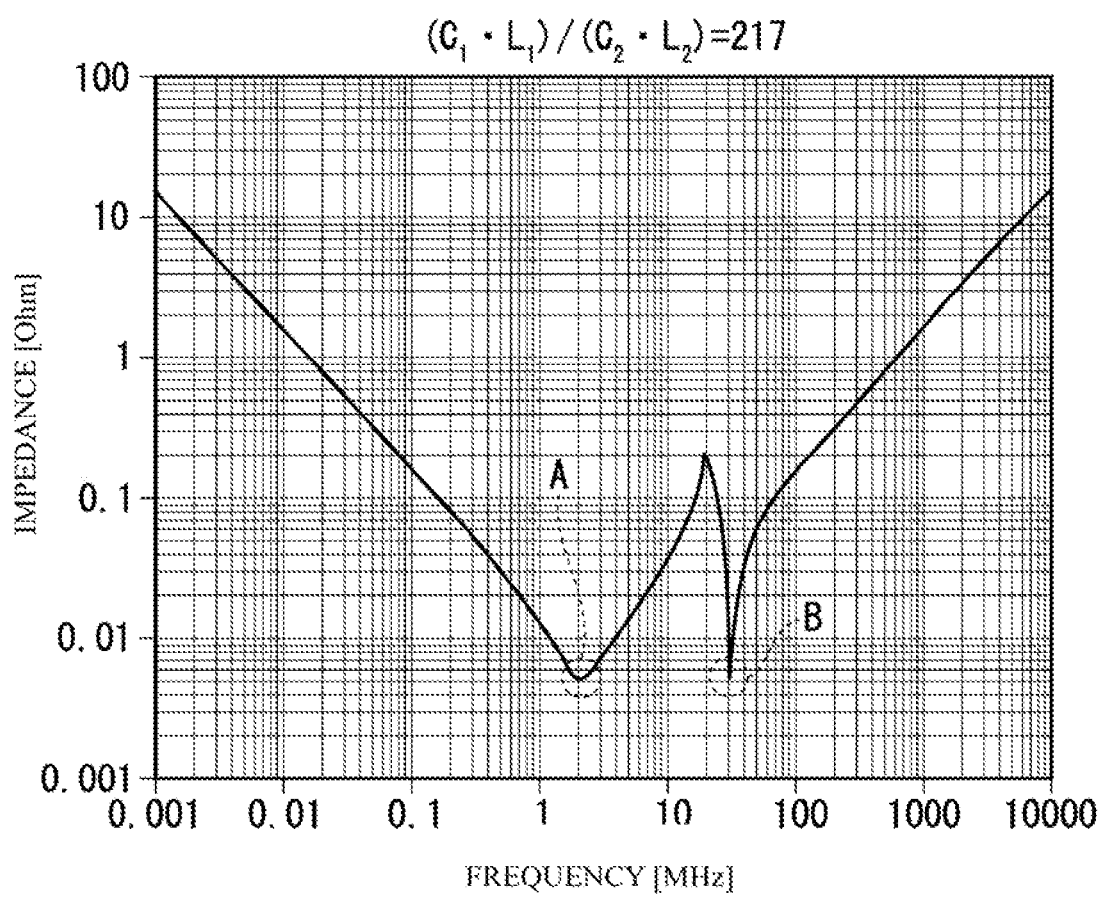
FIG. 12 illustrates a graph of a relationship between a frequency of a high frequency signal and impedance obtained when each value of data No. 3 of Table 4 is used.

From the comparison among the result of FIG. 12, the result of FIG. 13 and Table 4, the number of the local minimum point may be one or two in accordance with the value of $(C_1 \cdot L_1)/(C_2 \cdot L_2)$ in Table 4. And so, a description will be given of a critical value of $(C_1 \cdot L_1)/(C_2 \cdot L_2)$ at which the number of the local minimum point is changed from one to two will be reviewed.

Table 5 shows values of the parameters $C_1$, $C_2$, $L_1$ and $L_2$ used by the present inventor in order to find the critical value of $(C_1 \cdot L_1)/(C_2 \cdot L_2)$.

TABLE 5

| data No | R (Ω) | $L_1$ (H) | $C_1$ (F) | $L_2$ (H) | $C_2$ (F) | $(C_1 \cdot L_1)/(C_2 \cdot L_2)$ | $L_1/L_2$ |
|---|---|---|---|---|---|---|---|
| 1 | $5.0 \times 10^{-3}$ | $5.0 \times 10^{-10}$ | $1.0 \times 10^{-5}$ | $1.4 \times 10^{-9}$ | $1.0 \times 10^{-8}$ | 357 | 0.4 |
| 2 | $5.0 \times 10^{-3}$ | $5.0 \times 10^{-10}$ | $1.0 \times 10^{-5}$ | $5.0 \times 10^{-7}$ | $1.0 \times 10^{-8}$ | 1.0 | 0.001 |
| 3 | $5.0 \times 10^{-3}$ | $5.0 \times 10^{-10}$ | $1.0 \times 10^{-5}$ | $4.6 \times 10^{-10}$ | $5.0 \times 10^{-8}$ | 217 | 1.1 |
| 4 | $5.0 \times 10^{-3}$ | $5.0 \times 10^{-10}$ | $1.0 \times 10^{-5}$ | $8.6 \times 10^{-8}$ | $5.0 \times 10^{-8}$ | 1.2 | 0.006 |
| 5 | $5.0 \times 10^{-3}$ | $5.0 \times 10^{-10}$ | $1.0 \times 10^{-5}$ | $5.0 \times 10^{-7}$ | $5.0 \times 10^{-8}$ | 0.2 | 0.001 |
| 6 | $5.0 \times 10^{-3}$ | $5.0 \times 10^{-10}$ | $1.0 \times 10^{-5}$ | $5.0 \times 10^{-8}$ | $5.0 \times 10^{-8}$ | 2.0 | 0.01 |

Table 3 shows parameters $t_1$, $t_2$, $s_1$ and $s_2$ in the samples P1 and P2.

TABLE 3

| sample | $t_1$ (μm) | $t_2$ (μm) | $t_1/t_2$ | $s_1/s_2$ | $L_1/L_2$ | $(C_1 \cdot L_1)/(C_2 \cdot L_2)$ |
|---|---|---|---|---|---|---|
| P1 | 275 | 25 | 11.0 | 10.2 | 1.1 | 217 |
| P2 | 40 | 680 | 0.06 | 10.2 | 0.006 | 1.2 |

The data No. 3 and the data No. 4 of Table 4 are examples of the parameters $C_1$, $C_2$, $L_1$ and $L_2$ achieving the same value of $L_1/L_2$ as that of Table 3.

TABLE 4

| data No | R (Ω) | $L_1$ (H) | $C_1$ (F) | $L_2$ (H) | $C_2$ (F) | $(C_1 \cdot L_1)/(C_2 \cdot L_2)$ | $L_1/L_2$ |
|---|---|---|---|---|---|---|---|
| 1 | $5.0 \times 10^{-3}$ | $5.0 \times 10^{-10}$ | $1.0 \times 10^{-5}$ | $1.4 \times 10^{-9}$ | $1.0 \times 10^{-8}$ | 357 | 0.4 |
| 2 | $5.0 \times 10^{-3}$ | $5.0 \times 10^{-10}$ | $1.0 \times 10^{-5}$ | $5.0 \times 10^{-7}$ | $1.0 \times 10^{-8}$ | 1.0 | 0.001 |
| 3 | $5.0 \times 10^{-3}$ | $5.0 \times 10^{-10}$ | $1.0 \times 10^{-5}$ | $4.6 \times 10^{-10}$ | $5.0 \times 10^{-8}$ | 217 | 1.1 |
| 4 | $5.0 \times 10^{-3}$ | $5.0 \times 10^{-10}$ | $1.0 \times 10^{-5}$ | $8.6 \times 10^{-8}$ | $5.0 \times 10^{-8}$ | 1.2 | 0.006 |

The data No. 1 and the data No. 2 of Table 4 are the same as those of Table 2. On the other hand, the data No. 3 is an example of the parameters $C_1$, $C_2$, $L_1$ and $L_2$ such that the value of $L_1/L_2$ is equal to that of the first sample P1 of Table 3. The data No. 4 is an example of the parameters $C_1$, $C_2$, $L_1$ and $L_2$ such that the value of $L_1/L_2$ is equal to that of the second sample P2 in Table 3.

FIG. 12 illustrates a graph of a relationship between the frequency of the high frequency signal and the impedance Z obtained when each value of data No. 3 of Table 4 is substituted to the formula (3). As illustrated in FIG. 12, the graph has two local minimum points A and B. The same tendency as FIG. 4 is seen.

The data No. 5 and the data No. 6 of Table 5 indicate the values of the parameters $C_1$, $C_2$, $L_1$ and $L_2$ which are thought to be around the critical point at which the number of the local minimum point is changed from one to two.

Figure 14:
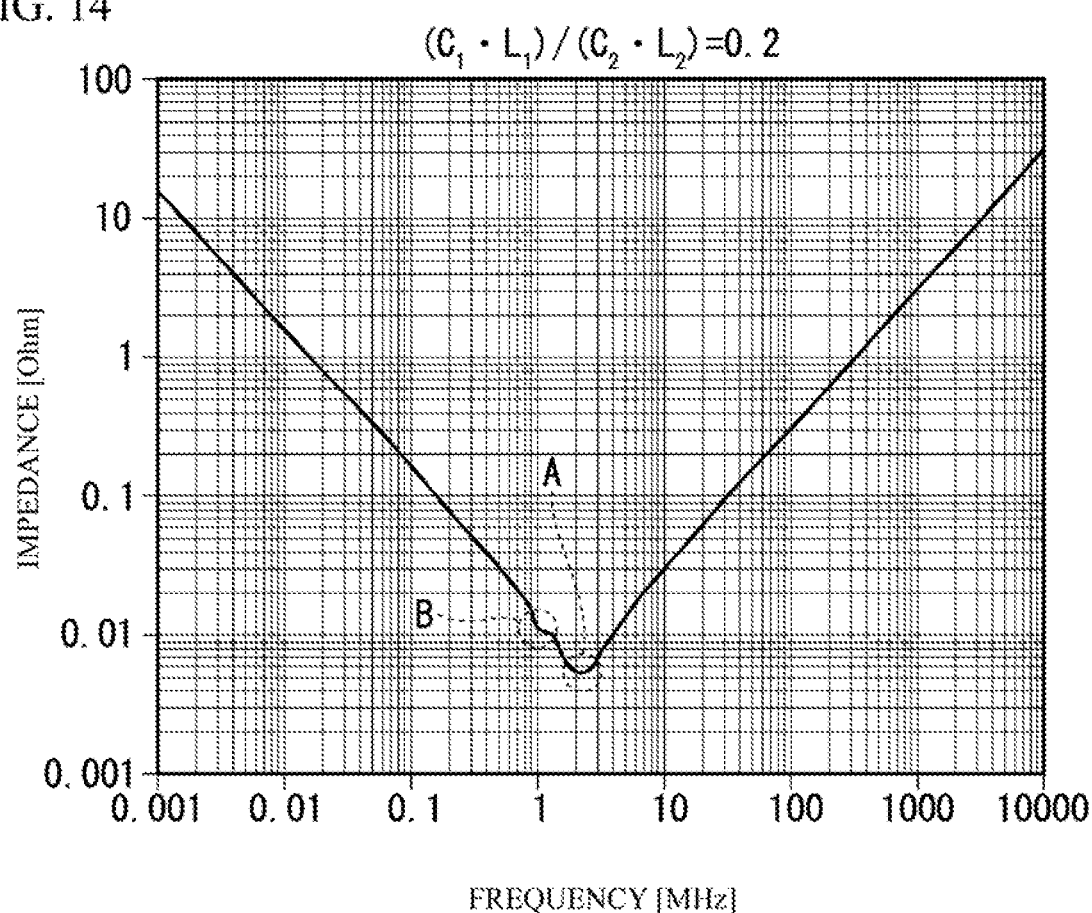
FIG. 14 illustrates a graph of a relationship between a frequency of a high frequency signal and impedance obtained when each value of data No. 5 of Table 5 is used.

FIG. 14 illustrates a graph of a relationship between the frequency of the high frequency signal and the impedance Z in a case where each value of the data No. 5 of Table 5 is substituted to the formula (3). The value of $(C_1 \cdot L_1)/(C_2 \cdot L_2)$ is 0.2 in the data No. 5. In this case, as illustrated in FIG. 14, another small local minimum point B appears near the local minimum point A.

Figure 15:
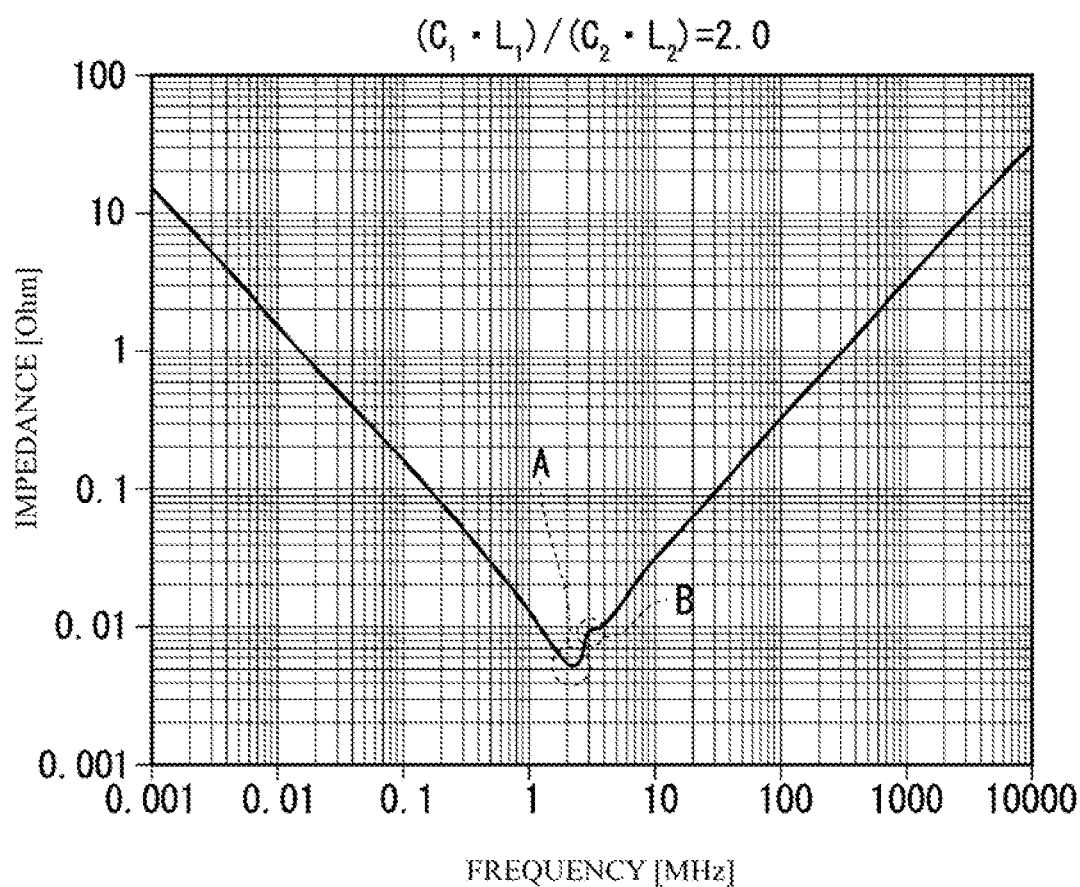
FIG. 15 illustrates a graph of a relationship between a frequency of a high frequency signal and impedance obtained when each value of data No. 6 of Table 5 is used.

FIG. 15 illustrates a graph of a relationship between the frequency of the high frequency signal and the impedance Z obtained in a case where each value of the data No. 6 of Table 5 is substituted to the formula (3). In the data No. 6, the value of $(C_1 \cdot L_1)/(C_2 \cdot L_2)$ is 2.0. In this case, as illustrated in FIG. 15, another local minimum point B appears near the local minimum point A.

Therefore, it is apparent that two local minimum points appear even if the value of $(C_1 \cdot L_1)/(C_2 \cdot L_2)$ is 0.2 or 2.0.

The present inventor researched the critical value of $(C_1 \cdot L_1)/(C_2 \cdot L_2)$ by using the parameters $C_1$, $C_2$, $L_1$ and $L_2$ of Table 5. Table 6 shows the parameters $C_1$, $C_2$, $L_1$ and $L_2$.

TABLE 6

| data No | R (Ω) | $L_1$ (H) | $C_1$ (F) | $L_2$ (H) | $C_2$ (F) | $(C_1 \cdot L_1)/(C_2 \cdot L_2)$ | $L_1/L_2$ |
|---|---|---|---|---|---|---|---|
| 1 | $5.0 \times 10^{-3}$ | $5.0 \times 10^{-10}$ | $1.0 \times 10^{-5}$ | $1.4 \times 10^{-9}$ | $1.0 \times 10^{-8}$ | 357 | 0.4 |
| 2 | $5.0 \times 10^{-3}$ | $5.0 \times 10^{-10}$ | $1.0 \times 10^{-5}$ | $5.0 \times 10^{-7}$ | $1.0 \times 10^{-8}$ | 1.0 | 0.001 |
| 3 | $5.0 \times 10^{-3}$ | $5.0 \times 10^{-10}$ | $1.0 \times 10^{-5}$ | $4.6 \times 10^{-10}$ | $5.0 \times 10^{-8}$ | 217 | 1.1 |
| 4 | $5.0 \times 10^{-3}$ | $5.0 \times 10^{-10}$ | $1.0 \times 10^{-5}$ | $8.6 \times 10^{-8}$ | $5.0 \times 10^{-8}$ | 1.2 | 0.006 |
| 5 | $5.0 \times 10^{-3}$ | $5.0 \times 10^{-10}$ | $1.0 \times 10^{-5}$ | $5.0 \times 10^{-7}$ | $5.0 \times 10^{-8}$ | 0.2 | 0.001 |
| 6 | $5.0 \times 10^{-3}$ | $5.0 \times 10^{-10}$ | $1.0 \times 10^{-5}$ | $5.0 \times 10^{-8}$ | $5.0 \times 10^{-8}$ | 2.0 | 0.01 |
| 7 | $5.0 \times 10^{-3}$ | $1.0 \times 10^{-10}$ | $1.0 \times 10^{-6}$ | $5.0 \times 10^{-11}$ | $1.0 \times 10^{-6}$ | 2.0 | 2.0 |
| 8 | $5.0 \times 10^{-3}$ | $1.0 \times 10^{-10}$ | $1.0 \times 10^{-6}$ | $2.5 \times 10^{-10}$ | $1.0 \times 10^{-6}$ | 0.4 | 0.4 |

Figure 16:
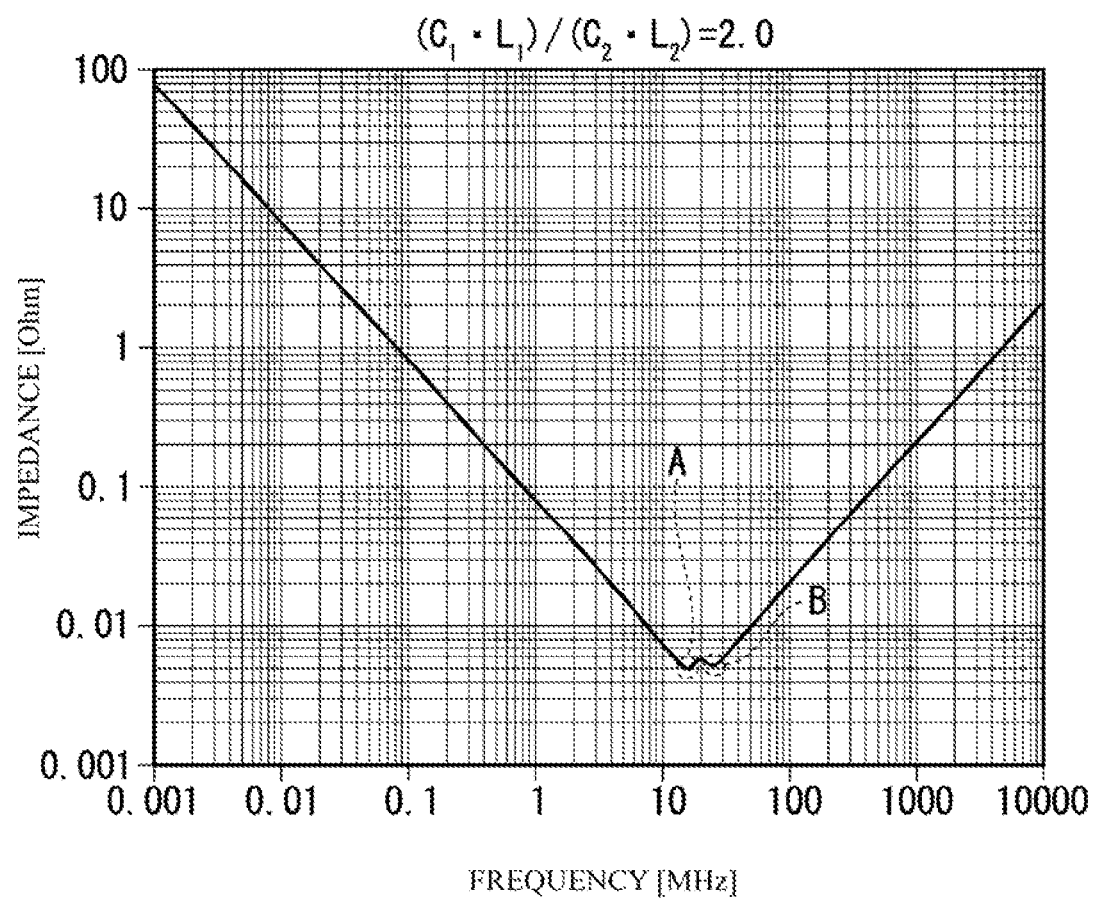
FIG. 16 illustrates a graph of a relationship between a frequency of a high frequency signal and impedance obtained when each value of data No. 7 of Table 5 is used.

FIG. 16 illustrates a relationship between the frequency of the high frequency signal and the impedance Z obtained in a case where each value of the data No. 7 of Table 6 is substituted to the formula (3). In the data No. 7, the value of $(C_1 \cdot L_1)/(C_2 \cdot L_2)$ is 2.0. In this case, as illustrated in FIG. 16, the two local minimum points A and B appeared.

Figure 17:
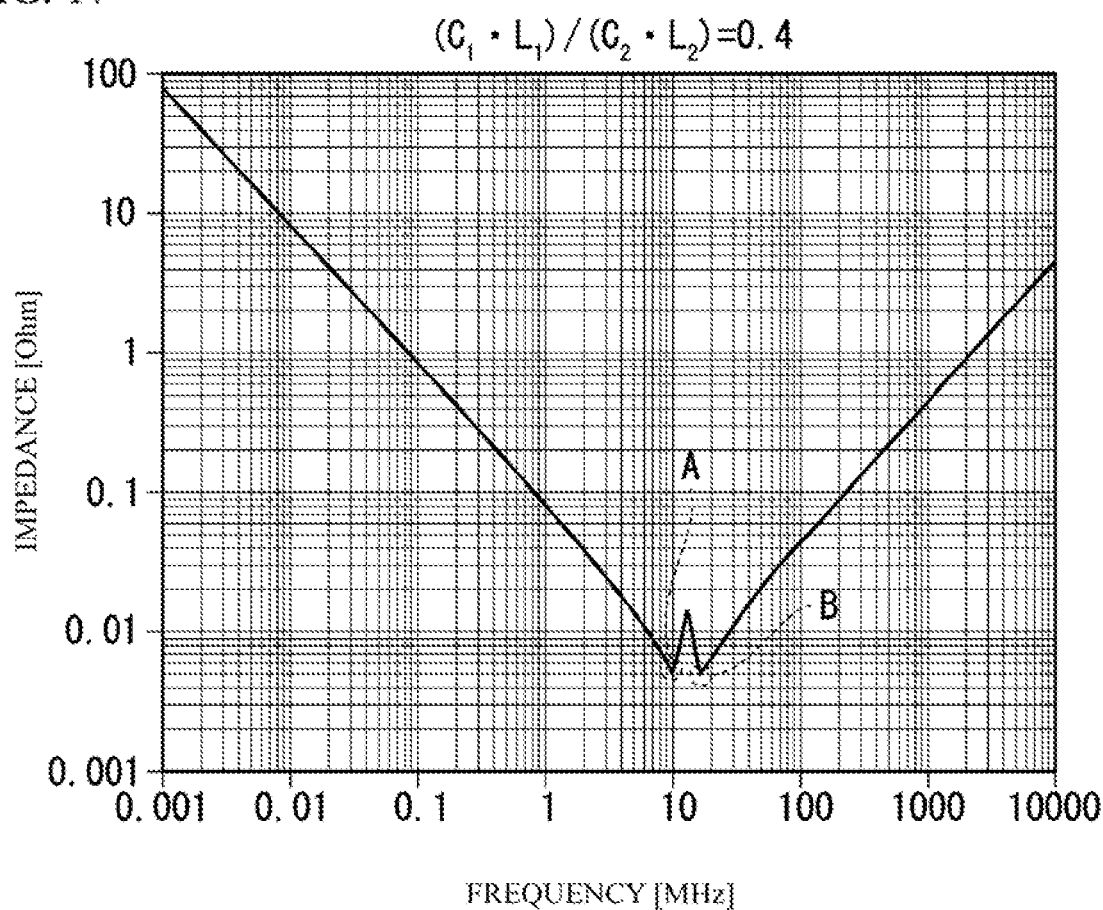
FIG. 17 illustrates a graph of a relationship between a frequency of a high frequency signal and impedance obtained when each value of data No. 8 of Table 6 is used.

FIG. 17 illustrates a graph of a relationship between the frequency of the high frequency signal and the impedance Z obtained in a case where each value of the data No. 8 of Table 6 is substituted to the formula (3). In the data No. 8, the value of $(C_1 \cdot L_1)/(C_2 \cdot L_2)$ is 0.4. In this case, as illustrated in FIG. 17, the two local minimum points A and B appear.

From the results, it is apparent that the multilayer ceramic capacitor 100 has two resonance frequencies when the value of $(C_1 \cdot L_1)/(C_2 \cdot L_2)$ satisfies the formula (15).

$$\frac{C_1 \cdot L_1}{C_2 \cdot L_2} < 0.5, \text{ or } 1.9 < \frac{C_1 \cdot L_1}{C_2 \cdot L_2} \quad (15)$$

On the other hand, $0.5 \leq (C_1 \cdot L_1)/(C_2 \cdot L_2) \leq 1.9$ is satisfied, the value of $(C_1 \cdot L_1)/(C_2 \cdot L_2)$ gets closer to 1. In this case, as indicated by the formula (10) or as illustrated in FIG. 9, the number of the resonance frequency of the multilayer ceramic capacitor 100 is one.

$(C_1 \cdot L_1)/(C_2 \cdot L_2) < 0.5$ or $1.9 < (C_1 \cdot L_1)/(C_2 \cdot L_2)$ is satisfied as mentioned above, in order to absorb the noise of the two frequencies of the multilayer ceramic capacitor 100.

In the samples P1 and P2, the first electrostatic capacity $C_1$ of the first capacity region 10a is 200 to 250 times as much as the second electrostatic capacity $C_2$ of the second capacity region 10b. And, the value of $C_1/C_2$ is 200 to 250 or the like.

When $C_1/C_2=250$ is satisfied in a first inequality of the formula (15) and $C_1/C_2=200$ is satisfied in a second inequality of the formula (15), the following formula (16) is obtained.

$$\frac{L_1}{L_2} < 0.002, \text{ or } 0.0095 < \frac{L_1}{L_2} \quad (16)$$

The formula (16) is inequality satisfied by $L_1/L_2$ when the value of $C_1/C_2$ is within 200 to 250. In the multilayer ceramic capacitor 100 in which the first electrostatic capacity $C_1$ is 200 to 250 times as large as the second electrostatic capacity $C_2$, two resonance frequencies appear when $L_1/L_2$ satisfies the formula (16).

(Modified embodiment) In the above-mentioned embodiment, as illustrated in FIG. 2, the thicknesses of the dielectric layers 11 of the first capacity region 10a are different from those of the dielectric layers 11 of the second capacity region 10b. Thereby, the first electrostatic capacity $C_1$ of the first capacity region 10a is larger than the second electrostatic capacity $C_2$ of the second capacity region 10b.

The structure is not limited. For example, a facing area of the internal electrode layers 12 next to each other may be changed. Thereby, the first electrostatic capacity $C_1$ may be larger than the second electrostatic capacity $C_2$.

Figure 18A:
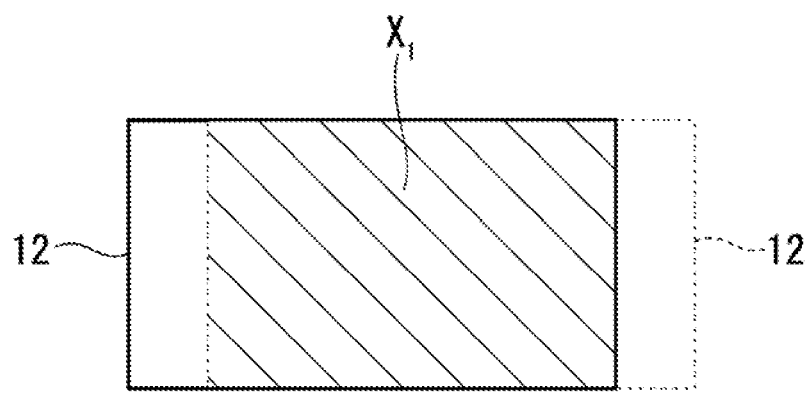
FIG. 18A schematically illustrate a plan view of a facing area in a first capacity region.
Figure 18B:
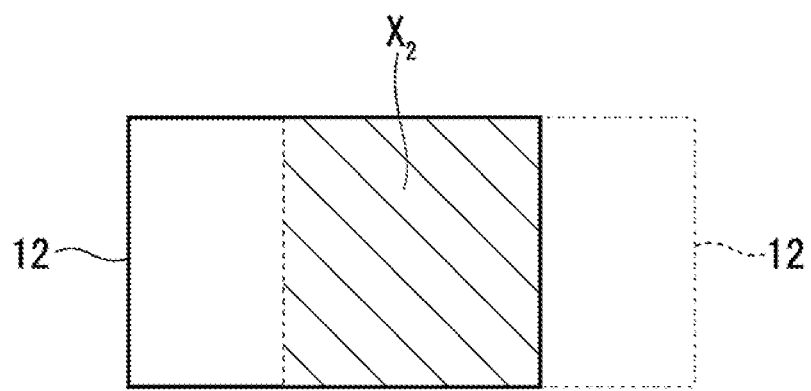
FIG. 18B schematically illustrate a plan view of a facing area in a second capacity region.

FIG. 18A and FIG. 18B schematically illustrate plan views of the facing area of the internal electrode layers 12. FIG. 18A schematically illustrates a plan view of a facing area $X_1$ in the first capacity region 10a. FIG. 18B schematically illustrates a plan view of a facing area $X_2$ in the second capacity region 10b.

As illustrated in FIG. 18A and FIG. 18B, when the facing area $X_1$ is larger than the facing area $X_2$, the first electrostatic capacity $C_1$ is larger than the second electrostatic capacity $C_2$.

In the above-mentioned embodiment, as illustrated in FIG. 2, the multilayer ceramic capacitor 100 has the two capacity regions (the first capacity region 10a and the second capacity region 10b). However, the number of the capacity regions is not limited to two. The multilayer ceramic capacitor 100 may have three or more of capacity regions.

Figure 19:
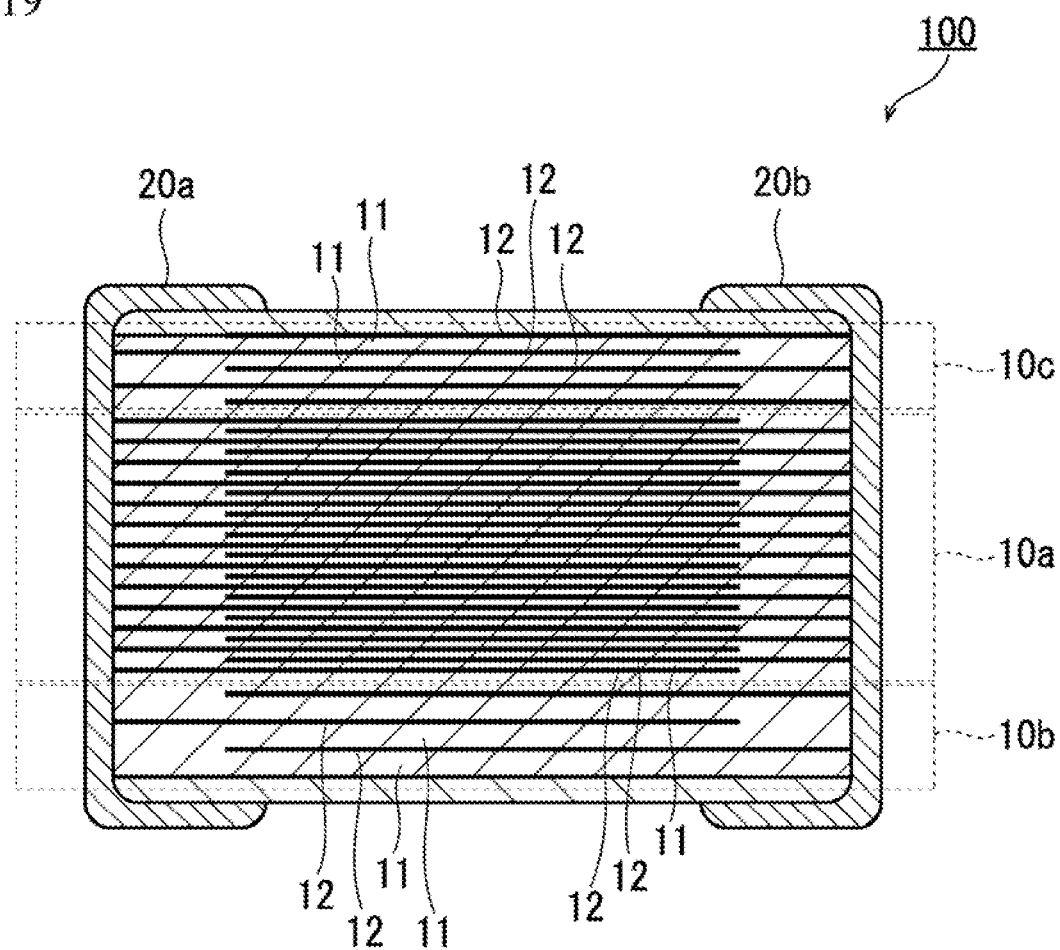
FIG. 19 illustrates a cross sectional view in a case where a multilayer ceramic capacitor has a first capacity region to a third capacity region.

FIG. 19 illustrates a cross sectional view of the multilayer ceramic capacitor 100 having the first capacity region 10a, the second capacity region 10b and a third capacity region 10c. The third capacity region 10c has a structure in which each of the dielectric layers 11 and the internal electrode layers 12 are alternately stacked, as well as the first capacity region 10a or the second capacity region 10b. In the third capacity region 10c, at least one of the facing area of the internal electrode layers 12 next to each other and the thickness of the dielectric layer 11 is different from those of the first capacity region 10a and the second capacity region 10b. With the structure, the third capacity region 10c has a third electrostatic capacity $C_3$ and a third inductance $L_3$.

In this case, two capacity regions are selected from the first capacity region 10a, the second capacity region 10b and the third capacity region 10c. And electrostatic capacities and inductances of the selected two capacity regions are referred to as $C_1$, $C_2$, $L_1$ and $L_2$. When $(C_1 \cdot L_1)/(C_2 \cdot L_2)$ satisfies the formula (15), it is expected that the multilayer ceramic capacitor 100 has two resonance frequencies.

Although the embodiments of the present invention have been described in detail, it is to be understood that the various change, substitutions, and alterations could be made hereto without departing from the spirit and scope of the invention. In the embodiments, the multilayer ceramic capacitor is described as an example of ceramic electronic devices. However, the embodiments are not limited to the multilayer ceramic capacitor. For example, the embodiments may be applied to another electronic device such as varistor or thermistor.

What is claimed is:

1. A ceramic electronic device comprising:
a multilayer chip in which each of internal electrode layers and each of dielectric layers are alternately stacked,
wherein the multilayer chip has a first capacity region having a first electrostatic capacity $C_1$ and a first inductance $L_1$ and a second capacity region having a second electrostatic capacity $C_2$ and a second inductance $L_2$,
wherein the first electrostatic capacity $C_1$, the first inductance $L_1$, the second electrostatic capacity $C_2$, and the second inductance $L_2$ are adjusted as follows to manifest two resonance frequencies:
$(C_1 \cdot L_1)/(C_2 \cdot L_2) < 0.5$ or $1.9 < (C_1 \cdot L_1)/(C_2 \cdot L_2)$, and
$200 \leq C_1/C_2 < 250$ or $950 < C_1/C_2$,
wherein the multilayer chip has a third capacity region of which each thickness of each dielectric layer is different from those of the first capacity region and the second capacity region,
the thickness of each dielectric layer of the second and third capacity regions is greater than that of the first capacity region, and
the first capacity region is sandwiched between the second and third capacity regions in a planar view against the internal electrode layers.

2. The ceramic electronic device as claimed in claim 1, wherein $L_1 = \alpha \cdot t_1 \cdot s_1$ and $L_2 = \alpha \cdot t_2 \cdot s_2$ are satisfied, when an interval between an undermost internal electrode layer in the first capacity region and a lower face of the multilayer chip is $t_1$, an interval between an undermost internal electrode layer of the second capacity region and the lower face of the multilayer chip is $t_2$, a number of the internal electrode layer in the first capacity region is $s_1$, a number of the internal electrode layer in the second capacity region is $s_2$, and a proportional constant is $\alpha$.

3. The ceramic electronic device as claimed in claim 1, wherein each thickness of each dielectric layer in the first capacity region is different from each thickness of each dielectric layer in the second capacity region.

4. The ceramic electronic device as claimed in claim 1, wherein each overlapped area between each two internal electrode layers next to each other in the first capacity region is different from each overlapped area between each two internal electrode layers next to each other in the second capacity region, in a planar view against the internal electrode layers.

5. The ceramic electronic device as claimed in claim 1, wherein $L_1/L_2 < 0.002$ or $0.0095 < L_1/L_2$ is satisfied.

6. The ceramic electronic device as claimed in claim 1, further comprising a wiring substrate on which the ceramic electronic device is mounted.

* * * * *